United States Patent
Yang

(10) Patent No.: US 11,751,358 B2
(45) Date of Patent: Sep. 5, 2023

(54) ELECTRICAL CONNECTOR CAGE ASSEMBLY AND ELECTRICAL CONNECTOR THEREWITH

(71) Applicant: ALL BEST PRECISION TECHNOLOGY CO., LTD., Taoyuan (TW)

(72) Inventor: Haven Yang, Taoyuan (TW)

(73) Assignee: ALL BEST PRECISION TECHNOLOGY CO., LTD., Taoyuan (TW)

( * ) Notice: Subject to any disclaimer, the term of this patent is extended or adjusted under 35 U.S.C. 154(b) by 563 days.

(21) Appl. No.: 17/075,712

(22) Filed: Oct. 21, 2020

(65) Prior Publication Data

US 2022/0124946 A1    Apr. 21, 2022

(51) Int. Cl.
| | |
|---|---|
| *H05K 7/20* | (2006.01) |
| *H01R 13/518* | (2006.01) |
| *F21V 8/00* | (2006.01) |
| *H01R 12/71* | (2011.01) |
| *H01R 13/658* | (2011.01) |

(52) U.S. Cl.
CPC ....... *H05K 7/20418* (2013.01); *G02B 6/0001* (2013.01); *H01R 12/714* (2013.01); *H01R 12/716* (2013.01); *H01R 13/518* (2013.01); *H01R 13/658* (2013.01)

(58) Field of Classification Search
CPC ..... H05K 7/20418; H05K 2201/10598; G02B 6/4261; G02B 6/4269
See application file for complete search history.

(56) References Cited

U.S. PATENT DOCUMENTS

| 11,032,946 B1* | 6/2021 | Yang | .................... G02B 6/4269 |
| 2020/0370843 A1* | 11/2020 | Jiwang | ..................... F28F 9/26 |
| 2021/0120701 A1* | 4/2021 | Chen | .................... G02B 6/4269 |

* cited by examiner

*Primary Examiner* — Mukundbhai G Patel
(74) *Attorney, Agent, or Firm* — Winston Hsu

(57) ABSTRACT

An electrical connector cage assembly includes a connector casing, a heat sink, and an attaching part. The heat sink includes a base and a plurality of fins extending from a top surface of the base. The fins extend above a marginal area of the top surface to form an open slot with the marginal area. The open slot has two end openings and a side opening extending to the end openings. The attaching part passes through the open slot and protrudes from the end openings to be detachably engaged with the connector casing to detachably fix the base onto the connector casing. Therein, the attaching part is separable from the heat sink from the side opening. An electrical connector includes a circuit board, an electrical connector base, and the electrical connector cage assembly. The electrical connector base is electrically connected onto the circuit board and exposed from the connector casing.

20 Claims, 8 Drawing Sheets

ELECTRICAL CONNECTOR CAGE ASSEMBLY AND ELECTRICAL CONNECTOR THEREWITH

BACKGROUND OF THE INVENTION

1. Field of the Invention

The present invention relates to an electrical connector, and more particularly to an electrical connector with a detachable heat-dissipating structure.

2. Description of the Prior Art

Electrical connectors are used widely in applications for power or signal connection, for example for connecting an electronic host device with an external device. As the transfer rate of the electrical connector is higher and higher, the electronic connector generates more and more heat. For this issue, a heat-dissipating structure (e.g. heat-dissipating fins) can be disposed on the outer casing of the electrical connector for convenience of heat dissipation. The heat-dissipating structure of some connectors adopts removable design. For example, the heat-dissipating structure includes a heat-absorbing plate and a plurality of fins extending upward from the heat-absorbing plate, and elastic clamps are used to fix the heat-absorbing plate and the fins on an outer casing of the connector. Therein, in some connectors, the elastic clamps cross and press against the fins, so that the upward extension length of the fins is limited and the elastic clamps also affect the heat dissipation effect of the heat convection on the fins to a certain extent. In some other connectors, the elastic clamps only cross and press against the heat-absorbing plate, and no fins exist on the portion of the heat-absorbing plate where the elastic clamps press. This structural configuration will also limit the overall heat dissipation effect to a certain extent. When the space for disposing the heat dissipation structure is limited, any structural configuration that reduces the space for disposing the fins will induce a significant adverse effect on the overall heat dissipation effect of the heat-dissipating structure.

SUMMARY OF THE INVENTION

An objective of the invention is to provide an electrical connector cage assembly having a detachable heat sink. The heat sink is detachably fixed onto a connector casing of the electrical connector cage assembly through a side portion of the heat sink, which can reduce the adverse effect of the fixing structure on the heat dissipation effect of the heat sink.

An electrical connector cage assembly according to the invention includes a connector casing, a heat sink, and an attaching part. The connector casing forms an insertion slot space and has an outer side wall. The heat sink includes a base and a plurality of fins. The base has a top surface. The plurality of fins extend from the top surface. The top surface has a marginal area in an extension direction. The plurality of fins extend above the marginal area to form an open slot with the marginal area. The open slot has two end openings and a side opening extending to the two end openings. The attaching part passes through the open slot and protrudes from the two end openings to be detachably engaged with the connector casing to detachably fix the base onto the outer side wall.

Another objective of the invention is to provide an electrical connector, which has one like the above electrical connector cage assembly and thereby can reduce the adverse effect on the heat dissipation effect of the detachable heat sink thereof through the fixing structure for the heat sink.

An electrical connector according to the invention includes an electrical connector cage assembly, and an electrical connector base. The electrical connector cage assembly includes a connector casing, a heat sink, and an attaching part. The connector casing forms an insertion slot space and has an outer side wall. The heat sink includes a base and a plurality of fins. The base has a top surface. The plurality of fins extend from the top surface. The top surface has a marginal area in an extension direction. The plurality of fins extend above the marginal area to form an open slot with the marginal area. The open slot has two end openings and a side opening extending to the two end openings. The attaching part passes through the open slot and protrudes from the two end openings to be detachably engaged with the connector casing to detachably fix the base onto the outer side wall. The electrical connector base is located in the connector casing and exposed from the insertion slot space.

Compared with the prior art, in the electrical connector cage assembly and the electrical connector according to the invention, the heat sink is fixed to the connector casing through a side portion of the base, which can reduce the adverse effect of the attaching part on the heat dissipation effect of the heat sink. Furthermore, the heat sink still retains fins above the side portion of the base, so the space above the side portion of the base can be used for dissipating heat, which also helps to reduce the adverse effect of the attaching part on the heat dissipation effect of the heat sink.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
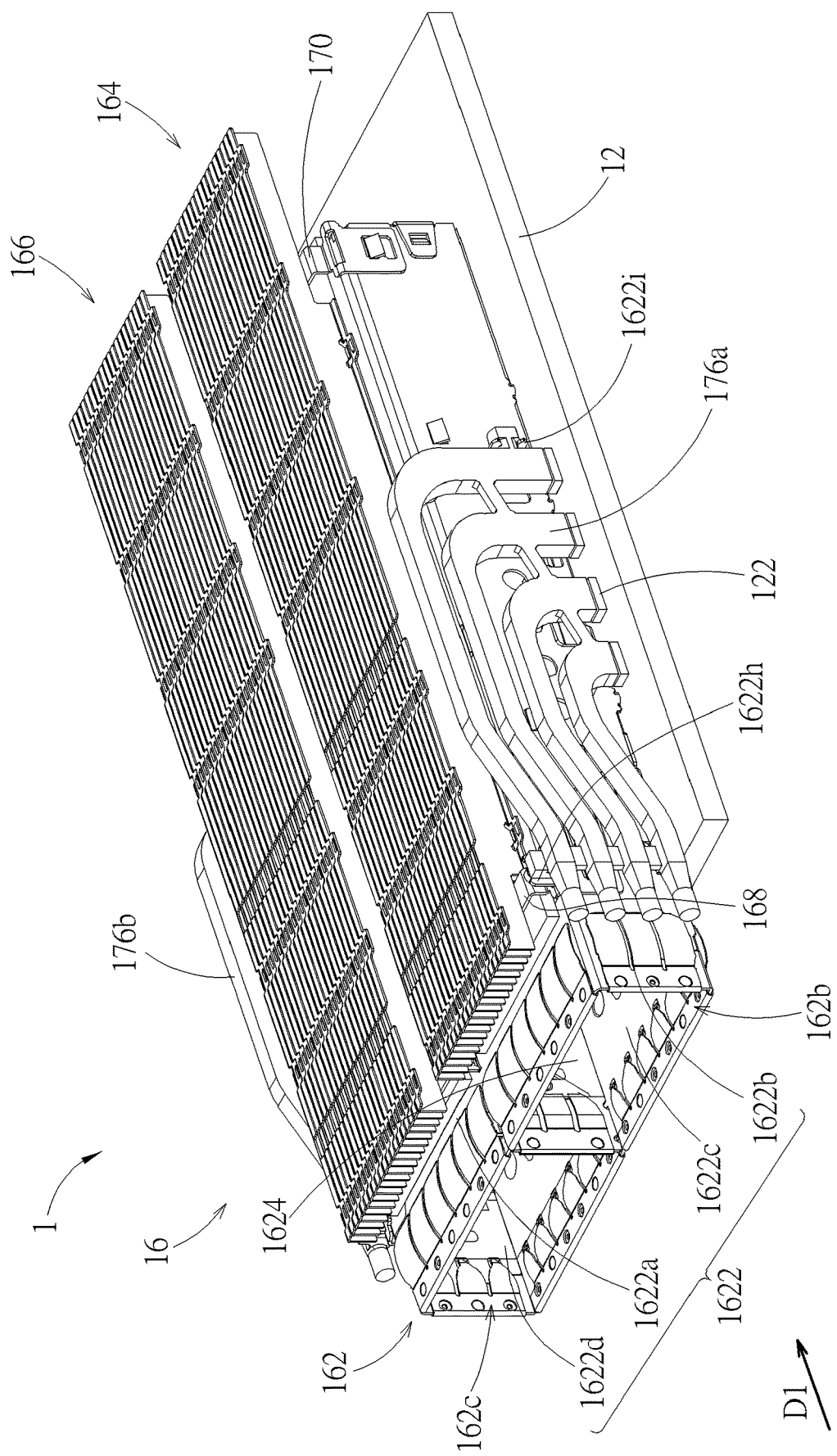
FIG. 1 is a schematic diagram illustrating an electrical connector of an embodiment according to the invention.
Figure 2:
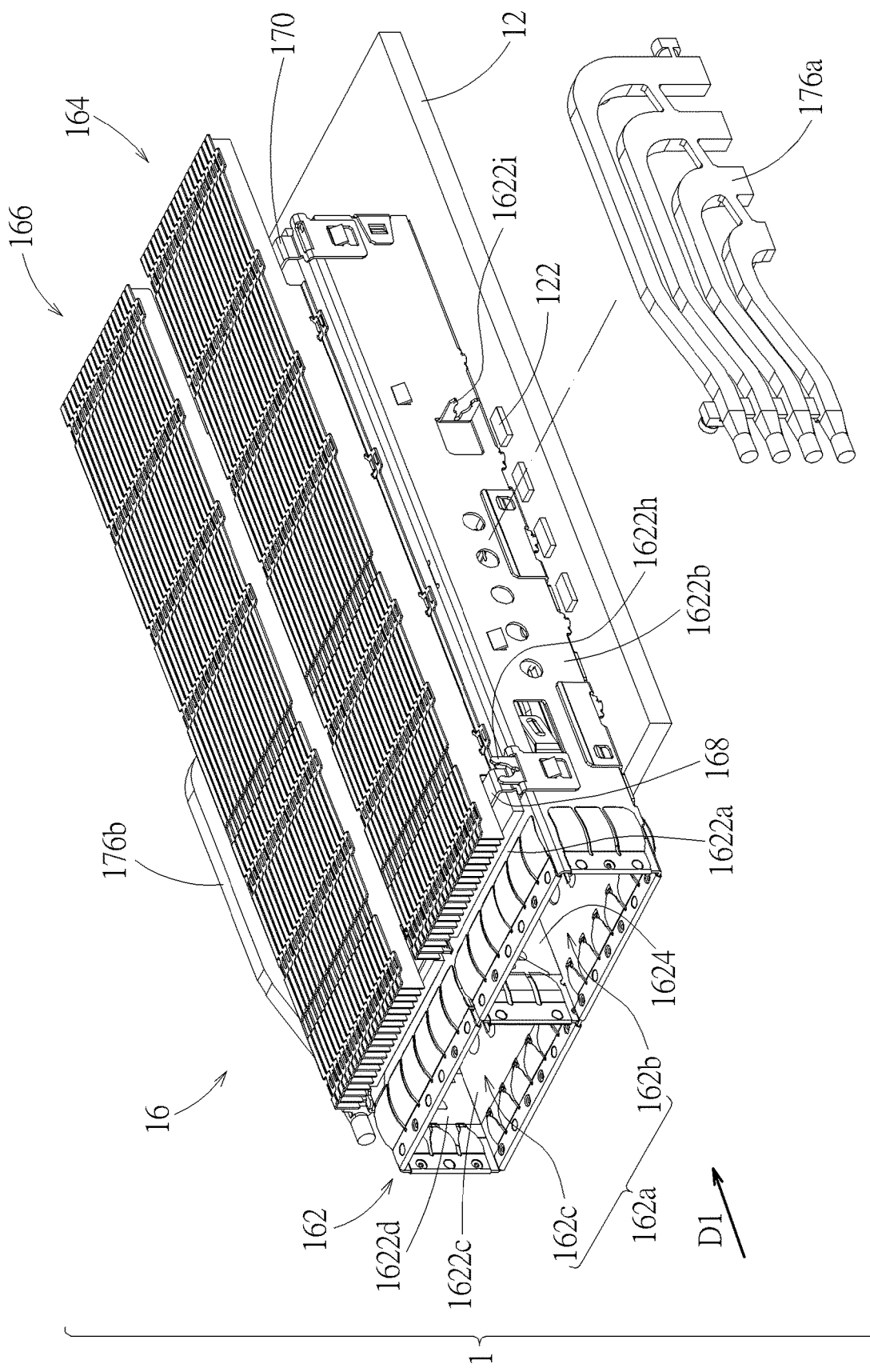
FIG. 2 is a partially exploded view of the electrical connector in FIG. 1.
Figure 3:
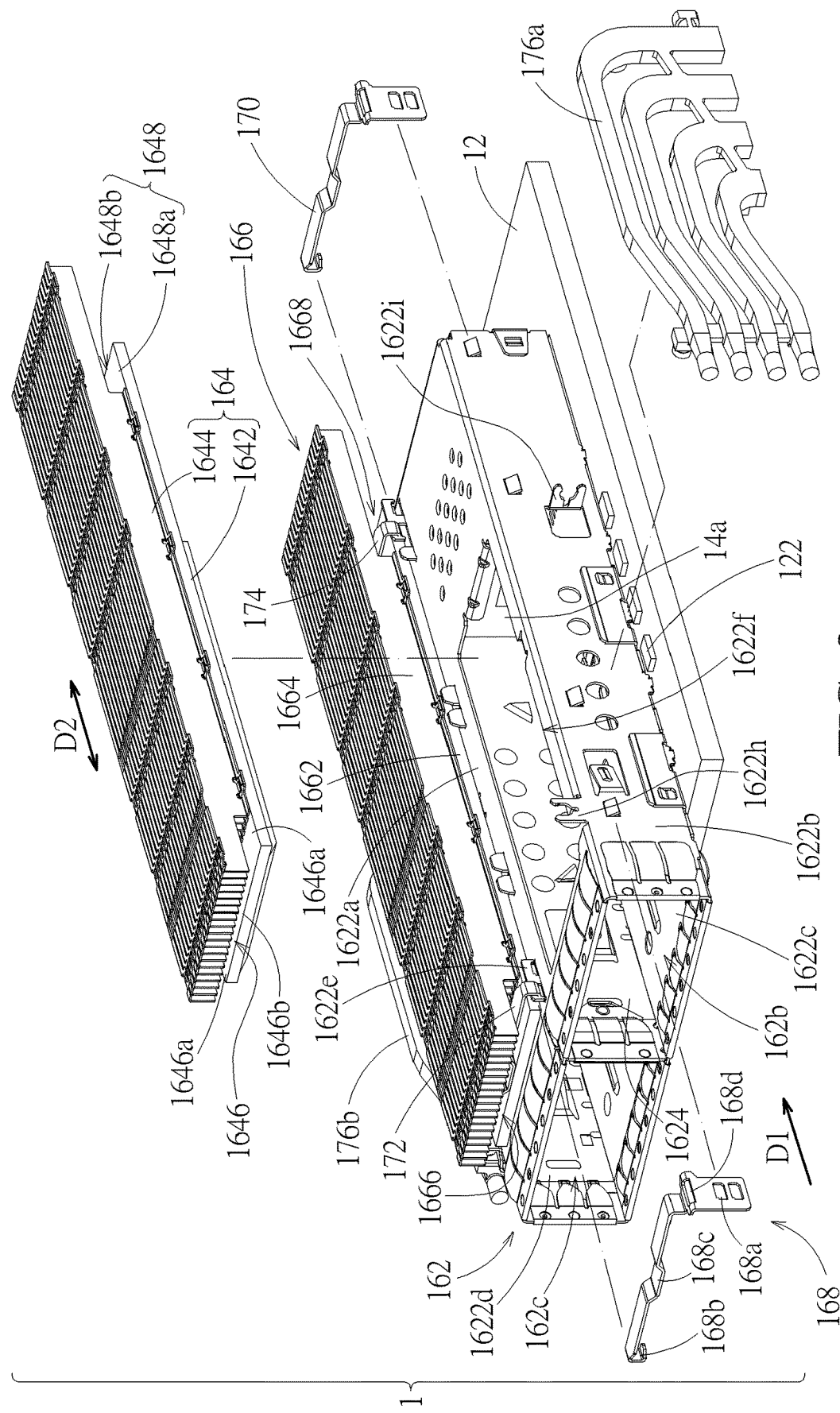
FIG. 3 is another partially exploded view of the electrical connector in FIG. 1.
Figure 4:
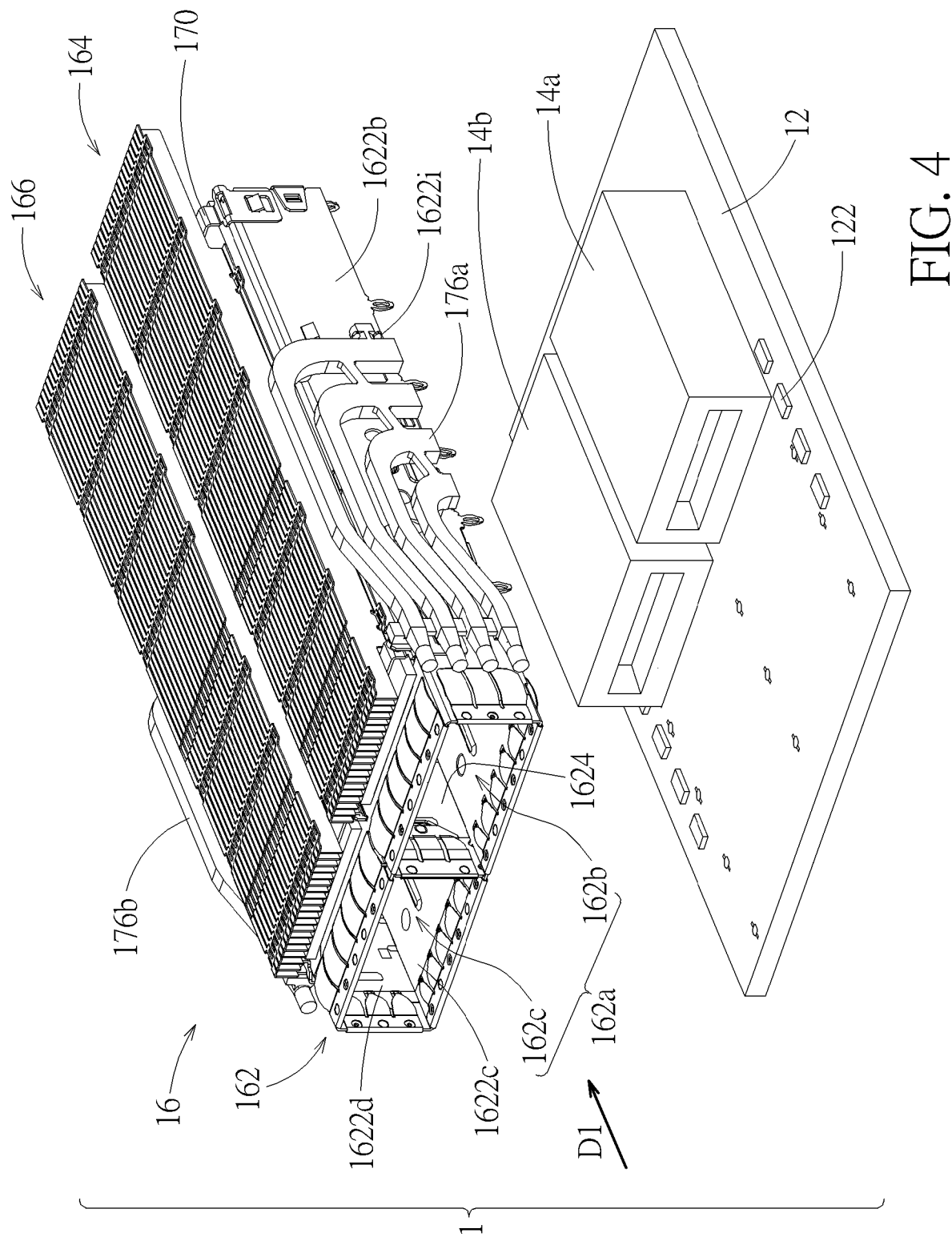
FIG. 4 is another partially exploded view of the electrical connector in FIG. 1.
Figure 5:
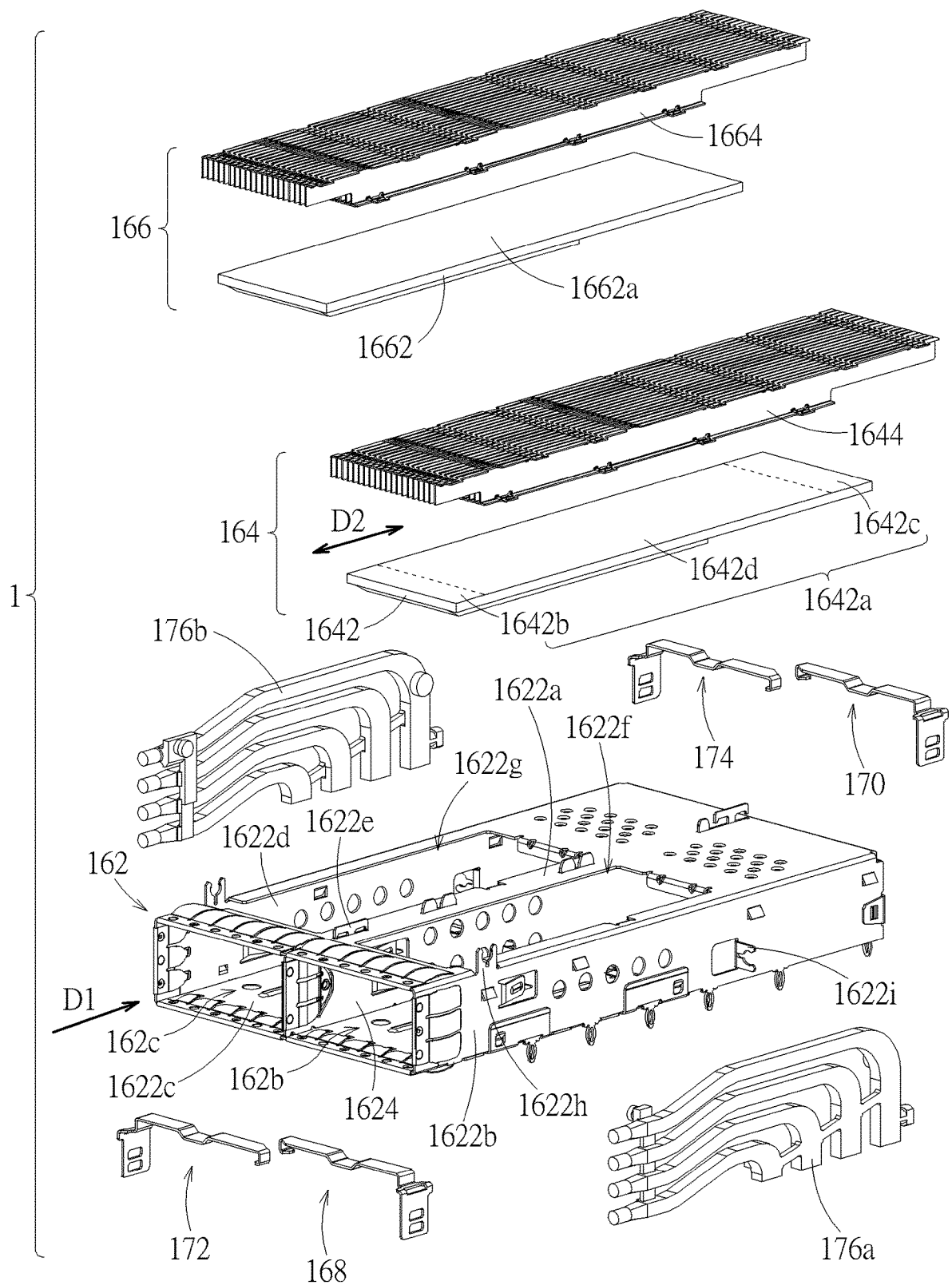
FIG. 5 is a partially exploded view of an electrical connector cage assembly of the electrical connector in FIG. 4.

Please refer to FIG. 1 to FIG. 6. An electrical connector 1 according to an embodiment includes a circuit board 12, two electrical connector bases 14a and 14b, and an electrical connector cage assembly 16. The electrical connector cage assembly 16 is fixed on the circuit board 12. The electrical connector bases 14a and 14b are electrically connected onto the circuit board 12 in the electrical connector cage assembly 16 and are shown in solid blocks in the figures for drawing simplification. In practice, the two electrical connector bases 14a and 14b can be structurally integrated into one single structure part for easy assembly. The electrical connector cage assembly 16 has a heat-dissipating structure capable of dissipating heat from a matching connector engaged with the electrical connector 1.

In the embodiment, the electrical connector cage assembly 16 includes a connector casing 162, a first heat sink 164, a second heat sink 166, a first attaching part 168, a second attaching part 170, a third attaching part 172, and a fourth attaching part 174. The first heat sink 164 is detachably fixed onto the connector casing 162 through the first attaching part 168 and the second attaching part 170. The second heat sink 166 is detachably fixed onto the connector casing 162 through the third attaching part 172 and the fourth attaching part 174. Therein, the connector casing 162 includes an outer side wall 1622 and an inner partition plate 1624. The outer side wall 1622 includes a top wall 1622a, a first side wall 1622b, a bottom wall 1622c (opposite to the top wall 1622a), and a second side wall 1622d (opposite to the first side wall 1622b) that are connected in sequence to form an insertion slot space 162a. The inner partition plate 1624 is disposed in the insertion slot space 162a and is connected to the top wall 1622a and the bottom wall 1622c through its two sides respectively to divide the insertion slot space 162a into a first insertion slot 162b and a second insertion slot 162c. The electrical connector bases 14a and 14b are located in the connector casing 162 and exposed from the first insertion slot 162b and the second insertion slot 162c respectively. Thereby, the electrical connector cage assembly 16 allows two matching connectors to insert; that is, the two matching connectors can be inserted into the first insertion slot 162b and the second insertion slot 162c in an insertion direction D1 (indicated by an arrow in the figures) to be engaged with the corresponding electrical connector bases 14a and 14b respectively.

The first heat sink 164 includes a first base 1642 and a plurality of first fins 1644 fixedly disposed on the first base 1642. The first base 1642 has a first top surface 1642a. In an extension direction D2 (indicated by a double-head arrow in the figures), the first top surface 1642a has a first marginal area 1642b, a second marginal area 1642c opposite to the first marginal area 1642b, and a fin connection area 1642d between the first marginal area 1642b and the second marginal area 1642c (which are separated by dashed lines). The plurality of first fins 1644 are fixedly disposed on the fin connection area 1642d and extend upward from the fin connection area 1642d. The plurality of first fins 1644 also extend parallel to the first top surface 1642a, and extend above the first marginal area 1642b and the second marginal area 1642c to form a first open slot 1646 and a second open slot 1648 with the first marginal area 1642b and the second marginal area 1642c respectively. The first open slot 1646 has two first end openings 1646a and a first side opening 1646b. The first side opening 1646b extends to the two first end openings 1646a. The second open slot 1648 has two second end openings 1648a and a second side opening 1648b. The second side opening 1648b extends to the two second end openings 1648a.

The first attaching part 168 passes through the first open slot 1646 and protrudes from the two first end openings 1646a to be detachably engaged with the connector casing 162. The second attaching part 170 passes through the second open slot 1648 and protrudes from the two second end openings 1648a to be detachably engaged with the connector casing 162. Thereby, the first attaching part 168 and the second attaching part 170 jointly detachably fix the first base 1642 onto the outer side wall 1622b (i.e. on the top wall 1622a corresponding to the first insertion slot 162b).

The first attaching part 168 and the second attaching part 170 substantially abut against the first base 1642, which can avoid or greatly reduce the impact on the heat dissipation airflow. Especially, when there is a forced airflow (e.g. by disposing a fan in front of the electrical connector 1 to generate an airflow parallel to the first fins 1644), the forced airflow can smoothly flow through the plurality of first fins 1644. Furthermore, in the embodiment, the first attaching part 168 is separable from the first heat sink 164 from the first side opening 1646b, and the second attaching part 170 is separable from the first heat sink 164 from the second side opening 1648b. The structural configuration allows the first heat sink 164 and the fixing structure therefor (i.e. the first attaching part 168 and the second attaching part 170) to be designed individually. The fixing structure can be designed to match different connector casings, increasing the application scope of the first heat sink 164 to the connector casing.

Furthermore, in the embodiment, the first attaching part 168 includes two engaging portions 168a and 168b and a pressing-against portion 168c connecting the two engaging portions 168a and 168b. After the first attaching part 168 fixes the first base 1642 on the top wall 1622a, the pressing-against portion 168c is located in the first open slot 1646 and elastically abuts against the first marginal area 1642b (of the first top surface 1642a of the first base 1642), and the engaging portions 168a and 168b protrude from the two first end openings 1646a and are detachably engaged with the outer side wall 1622 (of the connector casing 162). In the embodiment, the first heat sink 164 and the second heat sink 166 arranged side by side on the outer side wall 1622 in a direction perpendicular to the insertion direction D1. In the first attaching part 168, the engaging portion 168a (realized by a hole) is detachably engaged with a holding structure (realized by an outwardly protruding elastic tab) on the first side wall 1622b, and the engaging portion 168b (realized by a hook) is detachably engaged with a connecting portion 1622e (located between the first heat sink 164 and the second heat sink 166 and also detachably engaging with the third attaching part 172) fixedly disposed on the top wall 1622a. However, it is not limited thereto in practice. In practice, the structure of the engaging portions 168a and 168b depends on actual application products. For an example of the electrical connector, the electrical connector cage assembly thereof only allows a single matching connector to plug in. The attaching part thereof can be designed in the form of an n-shaped structure. Both ends of the attaching part can be designed in the same structure as the engaging portion 168a. For another example of the electrical connector, both ends of the attaching part thereof are detachably engaged to the top wall, in which both ends of the attaching part can be designed in the same structure as the engaging portion 168b. Furthermore, in the embodiment, the second attaching part 170 is the same structure as the first attaching part 168. For other descriptions about the second attaching part 170, please refer to the relevant descriptions of the first attaching part 168 and variants thereof in this article, which will not be repeated in addition.

In addition, in the embodiment, the first attaching part 168 and the second attaching part 170 cross the first base 1642 at front and rear sides of the first base 1642 (relative to the extension direction D2) respectively, so as to fix the first base 1642 firmly on the outer side wall 1622b; however, it is not limited thereto in practice. It is practice to use a single attaching part to fix the first heat sink 164 onto the connector casing 162. For example, a restraint structure is disposed on the connector casing 162 (for example, a limit slot is set on the top wall 1622*a*). The rear side of the first base 1642 is inserted into the limit slot; the front side of the first base 1642 is still fixed by the first attaching part 168. This structural configuration also can achieve the effect of firmly fixing the first heat sink 164 onto the connector casing 162. Furthermore, in the embodiment, the first attaching part 168 and the second attaching part 170 have the same structure; however, it is not limited thereto in practice. For example, the second attaching part 170 is realized by a clamping structure (such as a C-clamp), which clamps the rear side of the first base 1642 and the top wall 1622*a* at the same time. This structural configuration can also achieve the fixing effect of the aforementioned second attaching part 170. In addition, in the embodiment, the first base 1642 as a whole is roughly rectangular and has a lengthwise direction that is the same as the extension direction D2 and is parallel to the insertion direction D1; however, it is not limited thereto in practice. For example, in practice, the extension direction D2 can be defined as the width direction of the first base 1642 (i.e. perpendicular to the lengthwise direction), or other directions. For another example, in practice, in accordance with the actual product design, the lengthwise direction of the first base 1642 may not be parallel to the insertion direction D1 (for example, forming an acute angle); in this case, the extension direction D2 is not parallel to the insertion direction D1. For another example, in practice, the first attaching part 168 and the second attaching part 170 are not limited to be disposed at opposite sides of the first base 1642.

In the embodiment, the plurality of first fins 1644 are formed by stacking a plurality of metal stamping plates (e.g. but not limited to by engaging any two adjacent first fins 1644 with each other through engaging structures) and are thermally coupled with the first base 1642 (e.g. but not limited to soldering). However, it is not limited thereto in practice. For example, the plurality of first fins 1644 and the first base 1642 are integrally formed as a single part (e.g. by aluminum extrusion process or processing a thermally conductive metal block). Furthermore, in the embodiment, the first base 1642 is roughly plate-shaped, and the first top surface 1642*a* is also flat; however, it is not limited thereto in practice. For example, if the first top surface is convex, the first fin still can contact the first top surface through a corresponding curved surface to achieve thermally coupling, which will not be described in addition. In addition, in the embodiment, the plurality of first fins 1644 extend parallel to the extension direction D2; however, it is not limited thereto in practice. For example, the first fins 1644 extend obliquely relative to the extension direction D2. Furthermore, in the embodiment, the plurality of first fins 1644 extend outward perpendicular to the first top surface 1642*a*; however, it is not limited thereto. For example, the first fins 1644 extend obliquely outward from the first top surface 1642*a* and also extend perpendicular to the extension direction D2. In addition, in the embodiment, the plurality of first fins 1644 protrude from the first base 1642 parallel to the extension direction D2, which helps to increase the heat dissipation area of the first fins 1644 and thereby improve the heat dissipation efficiency. Furthermore, in the embodiment, the plurality of first fins 1644 as a whole cover the entire the first top surface 1642*a* in a direction perpendicular to the first top surface 1642*a*. This structural configuration can effectively utilize the space above the first top surface 1642*a* and does not need to reduce the overall volume of the plurality of first fins 1644 due to the disposition of the first attaching part 168 and the second attaching part 170. Thereby, the impact of the disposition of the first attaching part 168 and the second attaching part 170 on the heat dissipation efficiency of the first heat sink 164 can be reduced.

Figure 6:
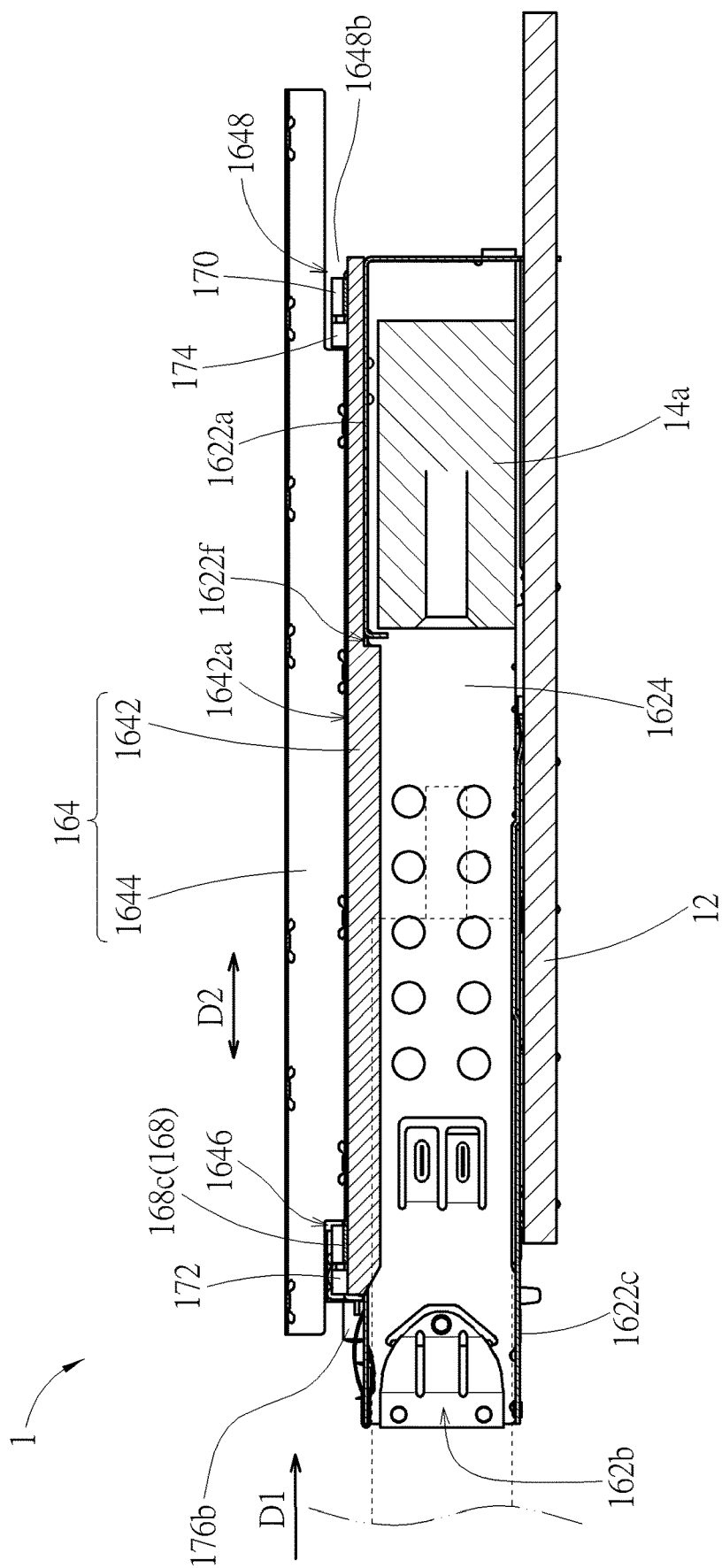
FIG. 6 is a sectional view of the electrical connector in FIG. 1 along the line X-X.

Furthermore, in the embodiment, the top wall 1622*a* of the outer side wall 1622 has a first window 1622*f* and a second window 1622*g* corresponding to the first heat sink 164 and the second heat sink 166. As shown by FIG. 6, the first base 1642 partially enters the first insertion slot 162*b* of the insertion slot space 162*a* through the first window 1622*f*, so that a matching connector (shown in dashed lines in FIG. 6) inserted into the first insertion slot 162*b* can touch the first base 1642 (i.e. touching the portion of the first base 1642 that enters the first insertion slot 162*b* through the first window 1622*f*) so that heat generated by the matching connector during operation can be dissipated through the first base 1642. Furthermore, due to the elasticity of the pressing-against portion 168*c*, the first heat sink 164 is allowed to move vertically, so that the matching connector and the first base 1642 (or the bottom thereof) can maintain a considerable contact force therebetween, which is conducive to the heat conduction between the matching connector and the first base 1642.

In the embodiment, the second heat sink 166 and the first heat sink 164 have the same structure. The third attaching part 172 and the fourth attaching part 174 are structurally symmetrical to the first attaching part 168 and the second attaching part 170. For other descriptions about the second heat sink 166, the third attaching part 172, and the fourth attaching part 174, please refer to the relevant descriptions of the first heat sink 164, the first attaching part 168, and the second attaching part 170 and variants thereof in this article, which will not be repeated in addition. Briefly, the second heat sink 166 is disposed adjacent to the first heat sink 164. The second heat sink 166 includes a second base 1662 and a plurality of second fins 1664. The second base 1662 has a second top surface 1662*a*. The plurality of second fins 1664 extend from the second top surface 1662*a* and form a third open slot 1666 and a fourth open slot 1668 with the second top surface 1662*a* at front and rear sides of the second base 1662. The third attaching part 172 and the fourth attaching part 174 pass through the third open slot 1666 and the fourth open slot 1668 respectively and thereby cross the second base 1662, so as to jointly detachably fix the second base 1662 onto the top wall 1622*a* (of the outer side wall 1622) corresponding to the second insertion slot 162*c*. Therein, an end portion 172*a* of the third attaching part 172 and an end portion (i.e. the engaging portion 168*b*) of the first attaching part 168 are oppositely engaged with the connecting portion 1622*e*. Another end portion 172*b* of the third attaching part 172 and another end portion (i.e. the engaging portion 168*a*) of the first attaching part 168 are engaged with the second side wall 1622*d* and the first side wall 1622*b* respectively. Same goes for the fourth attaching part 174 and will not be repeated in addition. Furthermore, same as the first base 1642, the second base 1662 partially enters the second insertion slot 162*c* of the insertion slot space 162*a* through the second window 1622*g*, so that a matching connector inserted into the second insertion slot 162*c* can touch the bottom of the second base 1662 so that heat generated by the matching connector during operation can be dissipated through the second base 1662. Furthermore, the third attaching part 172 and the fourth attaching part 174 are also flexible to allow the second heat sink 166 to move vertically, so that the matching connector and the bottom of the second base 1662 can maintain a considerable contact force therebetween, which is conducive to the heat conduction between the matching connector and the second base 1662.

In addition, in the embodiment, the electrical connector cage assembly 16 also includes two light-guiding structures 176a and 176b disposed outside the first side wall 1622b and the second side wall 1622d corresponding to the first insertion slot 162b and the second insertion slot 162c. The circuit board 12 is provided with a plurality of light sources 122 (e.g. but not limited to light-emitting diodes) corresponding to the light-guiding structures 176a and 176b. The light-guiding structures 176a and 176b can guide light emitted by the light sources 122 to the front side of the electrical connector cage assembly 16 as an optical indicator. Therein, the light-guiding structures 176a and 176b are fixed in the same way. The following takes the light-guiding structure 176a as an example. Corresponding to the light-guiding structure 176a, the outer side wall 1622 has two holding portions 1622h and 1622i protruding outward. The light-guiding structure 176a is disposed outside the first side wall 1622b by being held by the holding portions 1622h and 1622i. One of the holding portions (i.e. the holding portion 1622h) passes through a hole 168d of the first attaching part 168 to hold the light-guiding structure 176a, which avoids structural interference with the first attaching part 168. On the other hand, the holding portion 1622h also provides a positioning effect on the first attaching part 168.

Figure 7:
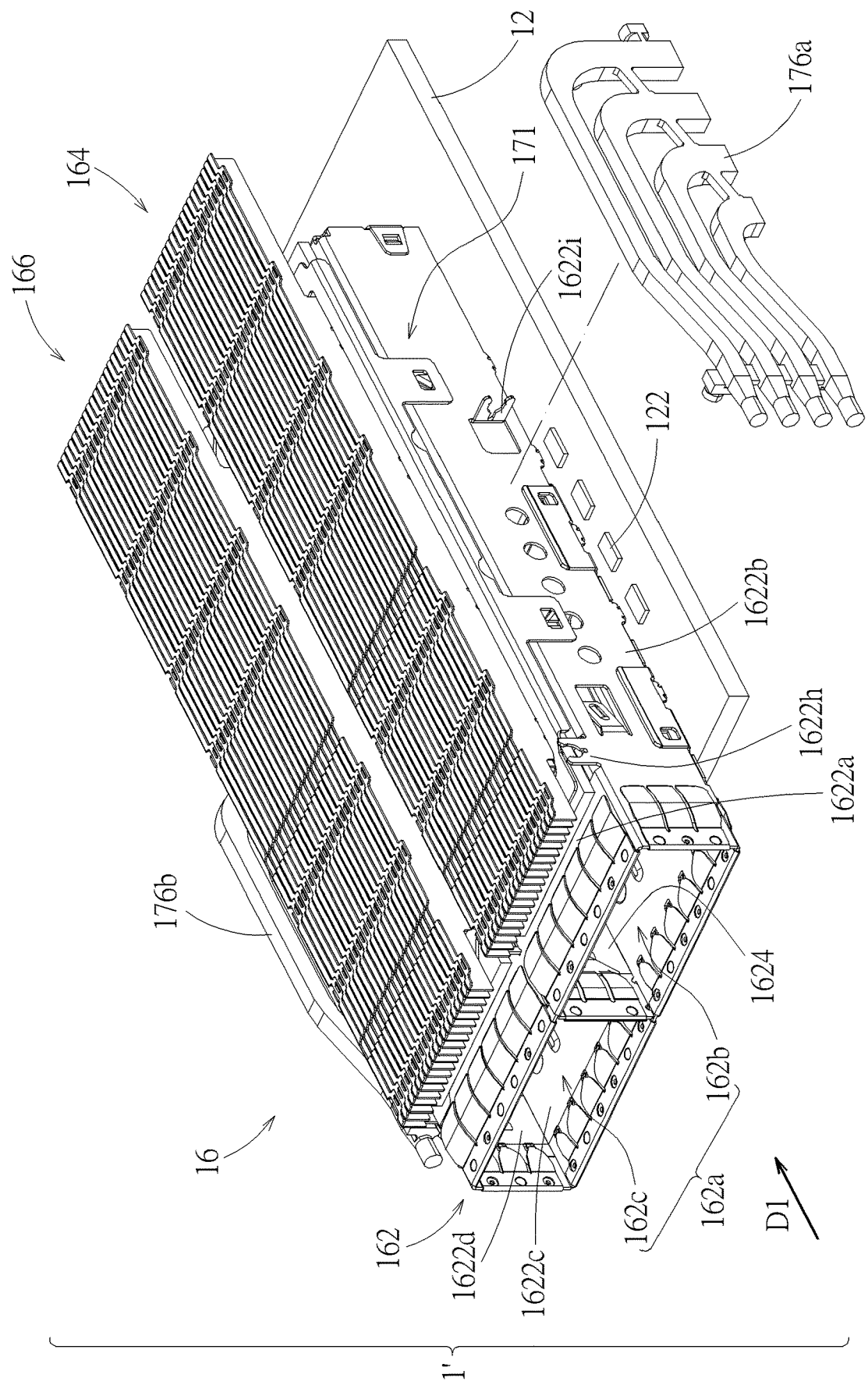
FIG. 7 is a partially exploded view of an electrical connector according to an embodiment.
Figure 8:
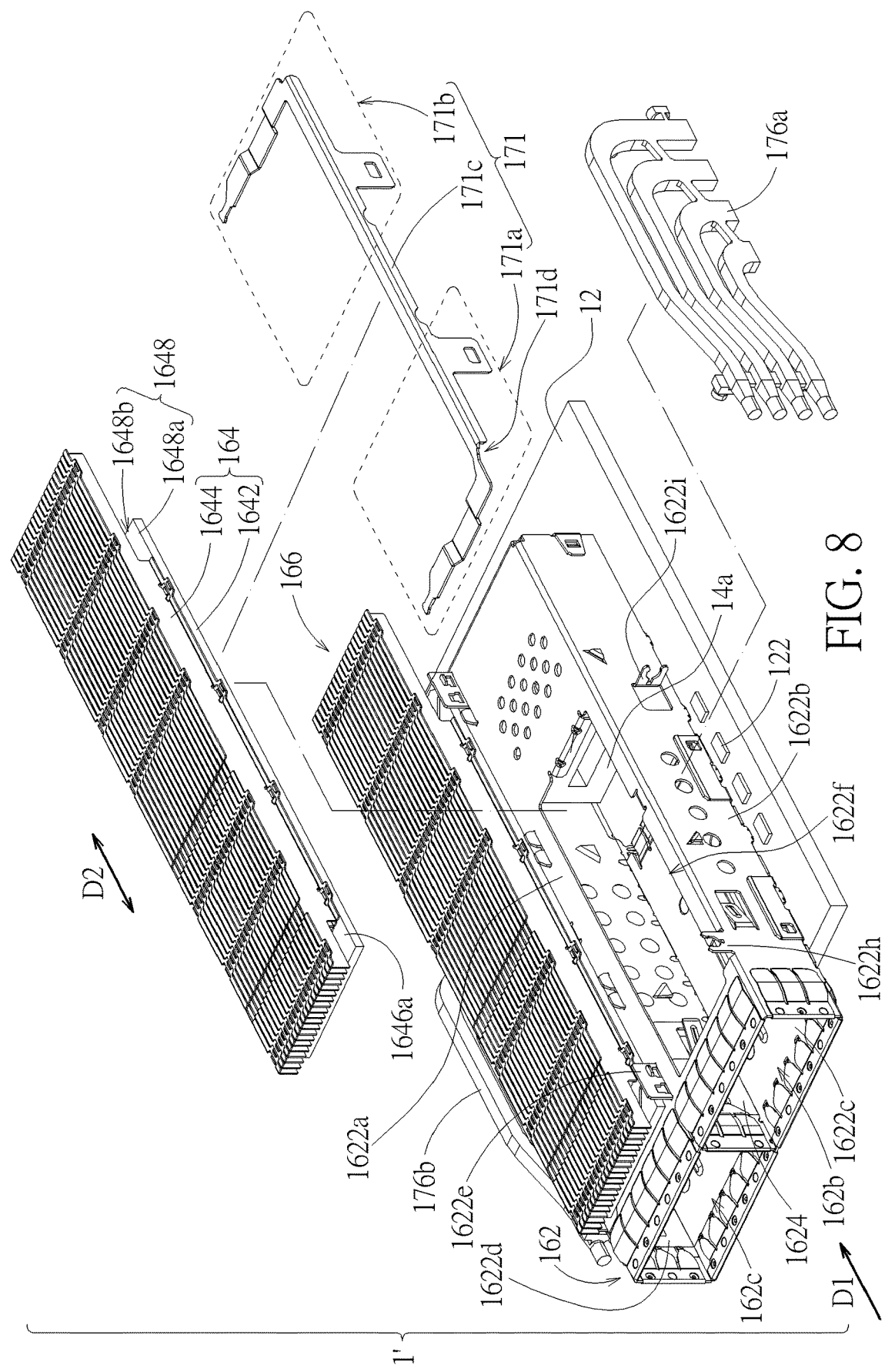
FIG. 8 is another partially exploded view of the electrical connector in FIG. 7.

In addition, in the embodiment, the first attaching part 168 and the second attaching part 170 are separate and fix the first heat sink 164 onto the top wall 1622a (of the outer side wall 1622); however, it is not limited thereto in practice. As shown by FIG. 7 and FIG. 8, an electrical connector 1' according to another embodiment is structurally similar to the aforementioned electrical connector 1 and uses the reference numbers of the electrical connector 1. For other descriptions about the electrical connector 1', please refer to the relevant descriptions of the electrical connector 1 and variations thereof, which will not be described. In the electrical connector 1', a single attaching part 171 is used for replacing the first attaching part 168 and the second attaching part 170. In logic, a first attaching portion 171a of the attaching part 171 (of which the structure is indicated by a dashed frame in FIG. 8) can be taken as the first attaching part 168; a second attaching portion 171b of the attaching part 171 (of which the structure is indicated by a dashed frame in FIG. 8) can be taken as the second attaching part 170; the first attaching portion 171a and the second attaching portion 171b are connected by a connecting portion 171c between them. In other words, the attaching part 171 is logically equivalent to a structure in which the first attaching part 168 and the second attaching part 170 are connected through the connecting portion 171c. The single attaching part 171 is conducive to reduction of the difficulty of assembly. In practice, the attaching part 171 can be formed by, but not limited to, pressing a single metal plate. In the embodiment, the attaching part 171 as a whole shows an H-shaped structure (or a slightly Y-shaped structure). The connecting portion 171c has an L-shaped cross section in the extension direction D2, which can increase the structural strength. The first attaching portion 171a has a notch 171d, which can avoid structural interference with the holding portion 1622h and can also reduce the influence of the attaching part 171 on the assembly of the light-guiding structure 176a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical connector cage assembly, comprising:
a connector casing, forming an insertion slot space and having an outer side wall;
a first heat sink, comprising a first base and a plurality of first fins, the first base having a first top surface, the plurality of first fins extending from the first top surface, the first top surface having a first marginal area in an extension direction at the end of the first base, the plurality of first fins extending above the first marginal area to form a first open slot with the first marginal area, the first open slot having two first end openings and a first side opening, the first side opening extending to the two first end openings; and
a first attaching part, passing through the first open slot and protruding from the two first end openings to be detachably engaged with the connector casing to detachably fix the first base onto the outer side wall.

2. The electrical connector cage assembly according to claim 1, wherein the plurality of first fins extend parallel to the extension direction.

3. The electrical connector cage assembly according to claim 2, wherein the plurality of first fins protrude from the first base parallel to the extension direction.

4. The electrical connector cage assembly according to claim 1, wherein the first attaching part comprises two engaging portions and a pressing-against portion connecting the two engaging portions, the first attaching part is detachably engaged with the connector casing through the two engaging portions and elastically presses against the first base through the pressing-against portion.

5. The electrical connector cage assembly according to claim 4, wherein the outer side wall has a window, and the first base partially enters the insertion slot space through the window.

6. The electrical connector cage assembly according to claim 1, further comprising a light-guiding structure, wherein the outer side wall has a holding portion protruding outward, the first attaching part has a hole, and the holding portion passes through the hole and protrudes from the first attaching part to hold the light-guiding structure.

7. The electrical connector cage assembly according to claim 1, further comprising a second attaching part, wherein the first top surface has a second marginal area opposite to the first marginal area in the extension direction, the plurality of first fins extend above the second marginal area to form a second open slot with the second marginal area, the second open slot has two second end openings and a second side opening, the second side opening extends to the two second end openings, and the second attaching part passes through the second open slot and protrudes form the two second end openings to be detachably engaged with the connector casing so that the first attaching part and the second attaching part jointly detachably fix the first base onto the outer side wall.

8. The electrical connector cage assembly according to claim 7, wherein the first attaching part and the second attaching part are connected to form a single attaching part.

9. The electrical connector cage assembly according to claim 1, further comprising a second heat sink and a third attaching part, wherein the second heat sink is disposed adjacent to the first heat sink, the second heat sink comprises a second base and a plurality of second fins, the second base has a second top surface, the plurality of second fins extend from the second top surface, and the third attaching part is adjacent to the first attaching part and crosses the second base to detachably fix the second base onto the outer side wall.

10. The electrical connector cage assembly according to claim 9, wherein the outer side wall has a top wall, a first side wall, a second side wall, and a connecting portion, the first side wall and the second side wall are oppositely connected to the top wall, the connecting portion is fixedly disposed on the top wall, the first heat sink and the second heat sink is fixed on the top wall through the first attaching part and the third attaching part respectively, the connecting portion is located between the first heat sink and the second heat sink, an end portion of the first attaching part and an end portion of the third attaching part are engaged with the connecting portion, and another end portion of the first attaching part and another end portion of the third attaching part are engaged with the first side wall and the second side wall respectively.

11. The electrical connector cage assembly according to claim 10, wherein the connector casing has an inner partition plate, the inner partition plate is disposed in the insertion slot space to divide the insertion slot space into a first insertion slot and a second insertion slot, and the first heat sink and the second heat sink are disposed on the top wall corresponding to the first insertion slot and the second insertion slot.

12. The electrical connector cage assembly according to claim 1, wherein the plurality of first fins are formed by stacking a plurality of metal stamping plates and are thermally coupled with the first base.

13. The electrical connector cage assembly according to claim 1, wherein the plurality of first fins cover the entire first top surface in a direction perpendicular to the first top surface.

14. The electrical connector cage assembly according to claim 1, wherein the insertion slot space defines an insertion direction, parallel to the extension direction.

15. The electrical connector cage assembly according to claim 1, wherein the extension direction is a lengthwise direction of the first base.

16. The electrical connector cage assembly according to claim 1, wherein the first attaching part is separable from the first heat sink from the first side opening.

17. An electrical connector, comprising:
an electrical connector cage assembly, comprising:
a connector casing, forming an insertion slot space and having an outer side wall;
a first heat sink, comprising a first base and a plurality of first fins, the first base having a first top surface, the plurality of first fins extending from the first top surface, the first top surface having a first marginal area in an extension direction at the end of the first base, the plurality of first fins extending above the first marginal area to form a first open slot with the first marginal area, the first open slot having two first end openings and a first side opening, the first side opening extending to the two first end openings; and
a first attaching part, passing through the first open slot and protruding from the two first end openings to be detachably engaged with the connector casing to detachably fix the first base onto the outer side wall; and
an electrical connector base, located in the connector casing and exposed from the insertion slot space.

18. The electrical connector according to claim 17, further comprising a circuit board, wherein the electrical connector cage assembly is fixed on the circuit board, the electrical connector base is electrically connected onto the circuit board and the first attaching part is separable from the first heat sink from the first side opening.

19. The electrical connector according to claim 17, wherein the electrical connector cage assembly comprises a light-guiding structure, the outer side wall has a holding portion protruding outward, the first attaching part has a hole, and the holding portion passes through the hole and protrudes from the first attaching part to hold the light-guiding structure.

20. The electrical connector according to claim 17, wherein the plurality of first fins cover the entire first top surface in a direction perpendicular to the first top surface.

* * * * *